(12) United States Patent  
Terada

(10) Patent No.: US 6,797,993 B2  
(45) Date of Patent: Sep. 28, 2004

(54) MONOLITHIC IC PACKAGE

(75) Inventor: Yukihiro Terada, Atsugi (JP)

(73) Assignee: Mitsumi Electric Co., Ltd., Tokyo (JP)

(*) Notice: Subject to any disclaimer, the term of this patent is extended or adjusted under 35 U.S.C. 154(b) by 208 days.

(21) Appl. No.: 10/185,392

(22) Filed: Jun. 28, 2002

(65) Prior Publication Data

US 2003/0011061 A1 Jan. 16, 2003

(30) Foreign Application Priority Data

Jul. 12, 2001 (JP) .................................... 2001-211481

(51) Int. Cl.⁷ ............................................. H01L 29/72
(52) U.S. Cl. ..................................... 257/173; 257/659
(58) Field of Search ................................. 257/780, 781, 257/778, 659, 698, 173

(56) References Cited

U.S. PATENT DOCUMENTS

| | | | | |
|---|---|---|---|---|
| 5,818,101 A | * | 10/1998 | Schuster | 257/659 |
| 5,869,869 A | * | 2/1999 | Hively | 257/355 |
| 5,970,321 A | * | 10/1999 | Hively | 438/123 |
| 6,046,901 A | * | 4/2000 | Davis et al. | 361/303 |
| 6,246,113 B1 | * | 6/2001 | Lin | 257/692 |
| 6,560,759 B2 | * | 5/2003 | Shinomiya | 716/8 |

* cited by examiner

Primary Examiner—S. V. Clark  
(74) Attorney, Agent, or Firm—Ladas & Parry

(57) ABSTRACT

A monolithic IC package, includes a monolithic IC, a package receiving the monolithic IC, an external connection terminal provided in the package and electrically connected to the monolithic IC by wiring, and protection means for protecting the monolithic IC from the electrostatic discharge, wherein the external connection terminal is used as the protection means.

6 Claims, 5 Drawing Sheets

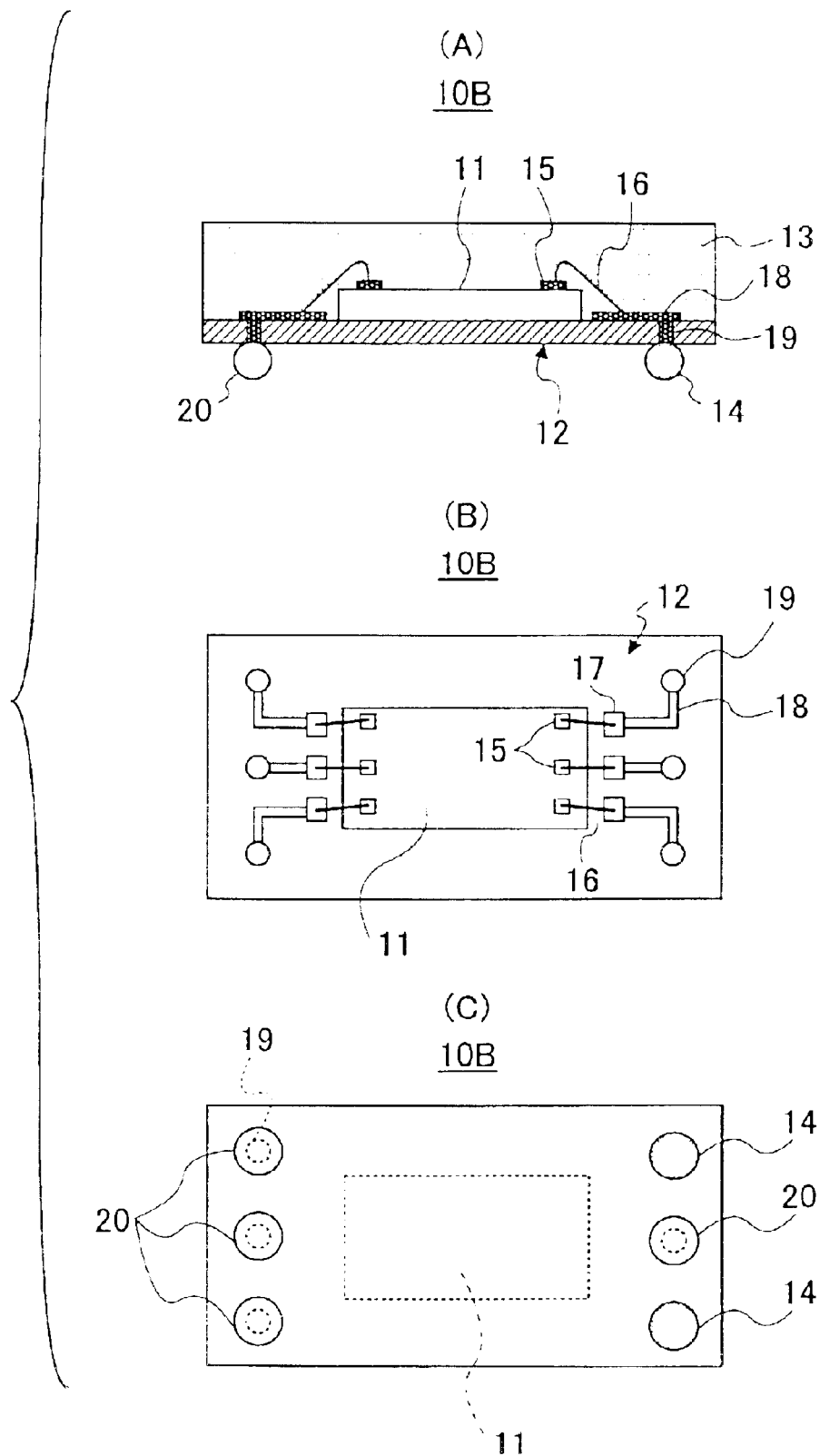

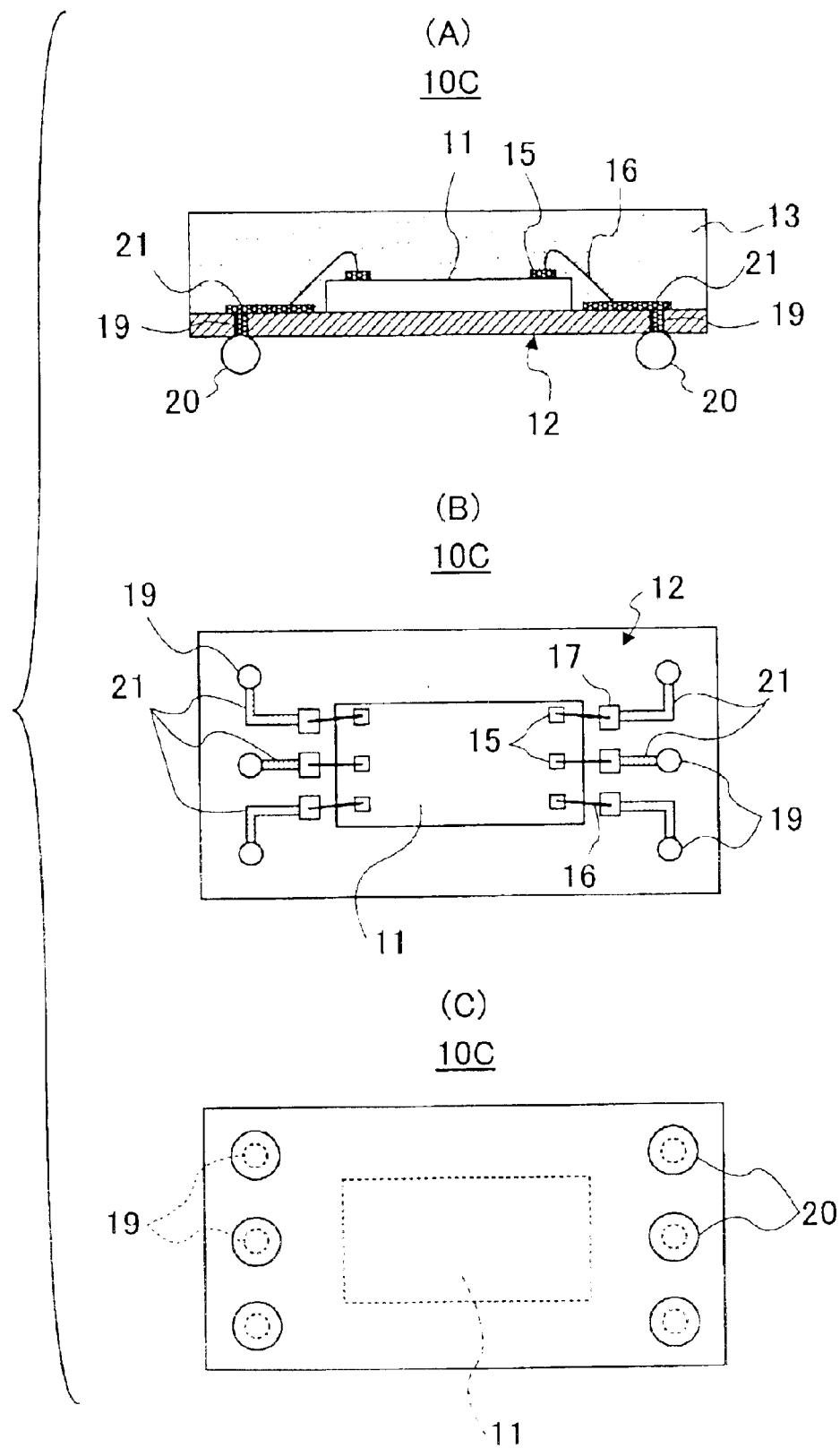

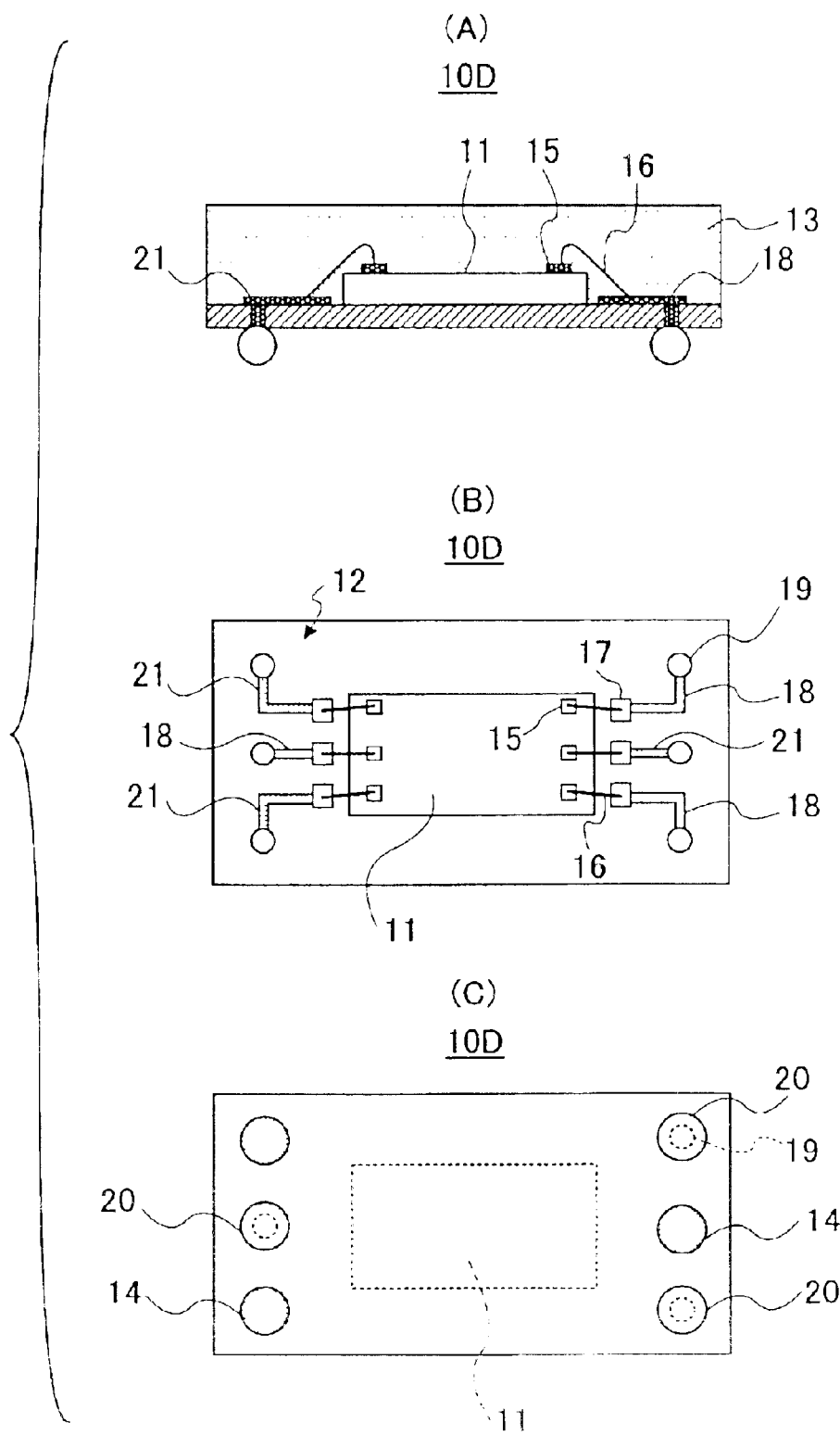

MONOLITHIC IC PACKAGE

BACKGROUND OF THE INVENTION

1. Field of the Invention

The present invention relates to monolithic IC packages, and more particularly, to a monolithic IC package having protection means for protecting the monolithic IC against electrostatic discharge.

2. Description of the Related Art

Recently, a monolithic IC package (hereinafter "IC package") in which a monolithic IC is provided has high density and is made drastically smaller. Hence, a small size package such as a CSP (chip size package) wherein the size of the IC package becomes the size of the IC chip has been developed and utilized.

Conventionally, for the above mentioned small size package, a metal having a low impedance such as Cu is used as the material for internal wiring comprising an interposer and a bump, which is an external connection terminal. Particularly, in a case where an IC for high frequency or a power IC is provided as a monolithic IC, a metal material having a low impedance is used as the material for the external connection terminal and the internal wiring. As a result of this, it is possible to make the signal speed high and reduce transfer loss.

However, an IC package (hereinafter "low resistance package"), in which a metal material having low impedance is used as external connection terminal material and internal wiring material, has a problem with respect to electrostatic discharge (ESD).

That is to say, if an operator or handling device having an electrification of static electricity comes in contact with the external connection terminal (bump or lead) having a low resistance in a manufacturing process or a mounting process of the low resistance package, the static electricity is discharged so that the monolithic IC may be electrostatically destroyed.

A conventional low resistance package has a structure in which a protection circuit for protecting the monolithic IC from the ESD, namely a circuit for improving an ESD resisting amount and an ESD resisting pressure, is provided in the monolithic IC, in order to prevent the above mentioned ESD.

However, if the protection circuit is provided in the monolithic IC, the monolithic IC becomes large, and therefore the low resistance package becomes large. Furthermore, in a case where the protection circuit is provided in the monolithic IC formed in a thin film making process and super fine process, the design and the manufacturing process for the monolithic IC become complicated so that cost for the monolithic IC rises.

SUMMARY OF THE INVENTION

Accordingly, it is a general object of the present invention to provide a novel and useful monolithic IC package in which one or more of the problems described above are eliminated.

Another and more specific object of the present invention is provide a monolithic IC package by which an ESD resisting amount and an ESD resisting pressure can be improved with a simple structure.

The above objects of the present invention are achieved by a monolithic IC package, including a monolithic IC, a package receiving the monolithic IC, an external connection terminal provided in the package and electrically connected to the monolithic IC by wiring, and protection means for protecting the monolithic IC from the electrostatic discharge, wherein the external connection terminal is used as the protection means.

According to the present invention, an external connection terminal is used as protection means. Hence, it is possible to improve an ESD resisting amount and an ESD resisting pressure with a simple structure. Accordingly, the monolithic IC and the wiring can be prevented from being destroyed due to static electricity. Therefore, it is possible to improve reliability with respect to the monolithic IC package.

The external connection terminal may be a lead or bump having a resistance value of 10 Ω through 100 kΩ.

According to the present invention, it is possible to improve the ESD resisting amount and the ESD resisting pressure by only making the external connection terminal being a lead or a bump have a resistance value of 10 Ω through 100 kΩ.

The above objects of the present invention are achieved by a monolithic IC package, including a monolithic IC, a package receiving the monolithic IC, an external connection terminal provided in the package and electrically connected to the monolithic IC by wiring, and protection means for protecting the monolithic IC from the electrostatic discharge, wherein the wiring is used as the protection means.

According to the present invention, the wiring is used as protection means. Hence, it is possible to improve an ESD resisting amount and an ESD resisting pressure can be improved with a simple structure. Accordingly, the monolithic IC and the wiring can be prevented from being destroyed due to static electricity. Therefore, it is possible to improve reliability with respect to the monolithic IC package.

The wiring may be a wire bonding or a wiring pattern having a resistance value of 10 Ω through 100 kΩ.

According to the present invention, it is possible to improve the ESD resisting amount and the ESD resisting pressure by only making the wiring being a bonding wire or a wiring pattern have a resistance value of 10 Ω through 100 kΩ.

Other objects, features, and advantages of the present invention will become more apparent from the following detailed description when read in conjunction with the accompanying drawings.

BRIEF DESCRIPTION OF THE DRAWINGS

FIG. 3-(A) is a cross sectional view of an IC package of a modified example of the first embodiment of the present invention, FIG. 3-(B) is a plan view of the IC package of the modified example of the first embodiment of the present invention in a state where a resin package is removed, and FIG. 3-(C) is a bottom view of the IC package of the modified example of the first embodiment of the present invention;

FIG. 4-(A) is a cross sectional view of an IC package of the second embodiment of the present invention, FIG. 4-(B) is a plan view of the IC package of the second embodiment of the present invention in a state where a resin package is removed, and FIG. 4-(C) is a bottom view of the IC package of the second embodiment of the present invention; and FIG. 5-(A) is a cross sectional view of an IC package of a modified example of the second embodiment of the present invention, FIG. 5-(B) is a plan view of the IC package of the modified example of the second embodiment of the present invention in a state where a resin package is removed, and FIG. 5-(C) is a bottom view of the IC package of the modified example of the second embodiment of the present invention.

DETAILED DESCRIPTION OF THE PREFERRED EMBODIMENTS

A description will now be given, with reference to the drawings, of embodiments of the present invention.

Figure 1:
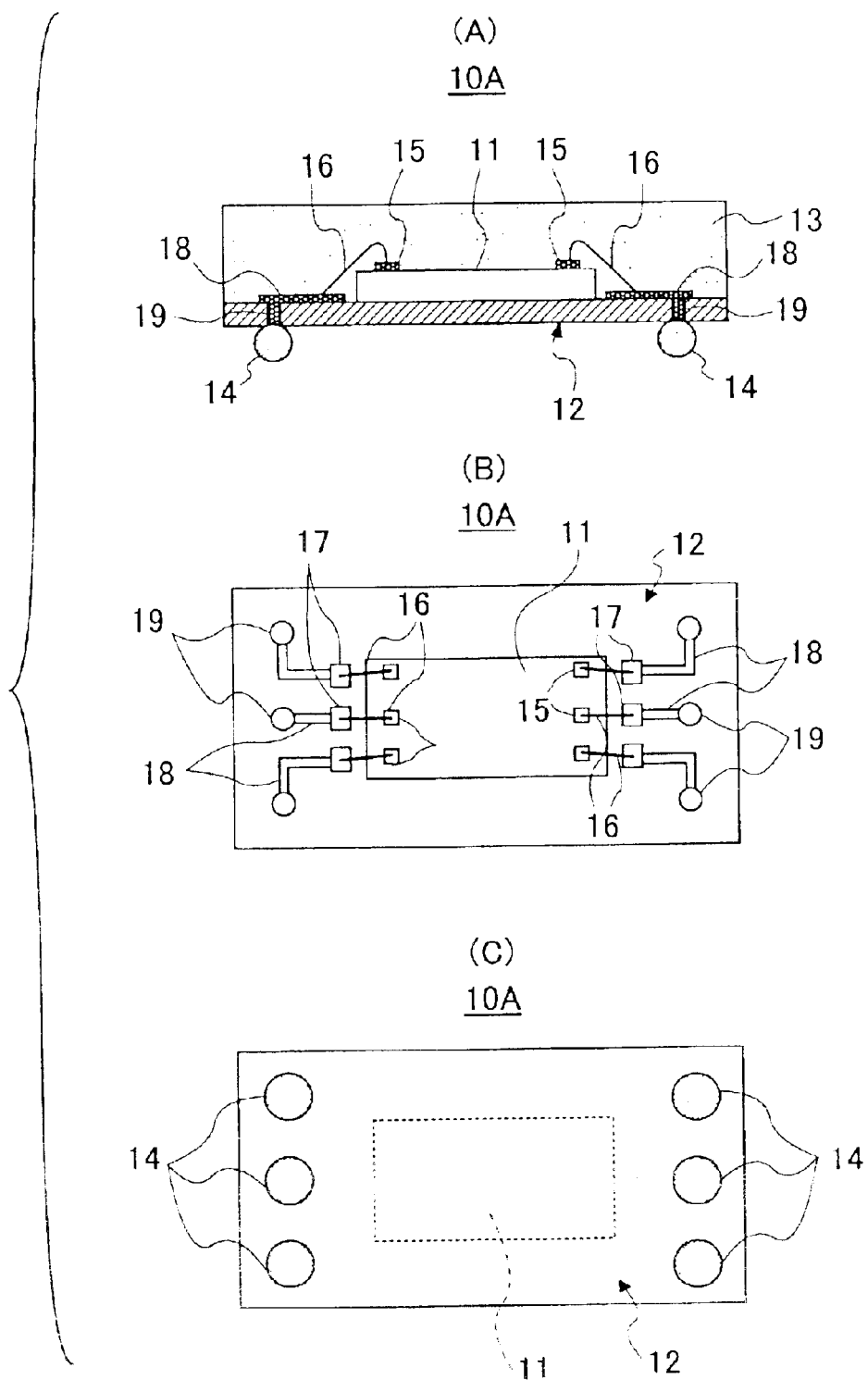
FIG. 1-(A) is a cross sectional view of an IC package of the first embodiment of the present invention, FIG. 1-(B) is a plan view of the IC package of the first embodiment of the present invention in a state where a resin package is removed, and FIG. 1-(C) is a bottom view of the IC package of the first embodiment of the present invention.

A monolithic IC package (hereinafter "IC package") 10A of the first embodiment of the present invention is shown in FIG. 1. FIG. 1-(A) is a cross sectional view of the IC package 10A of the first embodiment of the present invention, FIG. 1-(B) is a plan view of the IC package 10A of the first embodiment of the present invention in a state where the resin package 13 is removed, and FIG. 1-(C) is a bottom view of the IC package 10A of the first embodiment of the present invention.

The IC package 10A mainly comprises a monolithic IC 11, an interposer 12, a resin package 13, and a high resistance package 14. Although a BGA (ball grid alley) type package is applied as the IC package 10A in this embodiment, the present invention is not limited to the above mentioned BGA. Rather, the present invention can be applied other kinds of IC packages such as a CSP or others.

The monolithic IC 11 is formed by a thin film making process, a super fine process and others. The monolithic IC 11 has a structure in which a large number of circuit elements such as an active element and a passive element are, in a body, provided in one IC chip. On the above mentioned point, the monolithic IC has a different structure from the structure of a hybrid IC in which active parts such as a condenser that cannot be formed on the IC chip are mounted on a substrate with the IC chip.

The monolithic IC 11 used in this embodiment does not have a protection circuit for protecting from electrostatic destruction due to the ESD, namely a circuit for improving an ESD resisting amount and an ESD resisting pressure. Even if the protection circuit is provided in the monolithic IC 11, a ratio of the protection circuit to the monolithic IC 11 becomes approximately half of the conventional art, namely very small.

The interposer 12 is a circuit board. The monolithic IC 11 is mounted on a surface of the interposer 12. The high resistance bump 14 being an external connection terminal is provided on the back surface of the interposer 12. As shown in FIG. 1-(B), a bonding pad 17 and the wiring 18 are, in a body, formed on the surface of the interposer 12.

The bonding pad 17 is electrically connected to the electrode pad 15 of the monolithic IC 11 by a wire 16. An end part of the wiring 18 is connected to this bonding pad 17. Another end part of the wiring 18 is connected to a through hole 19.

The through hole 19 is formed as piercing the front and the back of the interposer 12. Conductive metal such as copper is filled up inside of the through hole 19. The high resistance bump 14 is provided at the lower part of the through hole 19.

In this embodiment, the high resistance bump 14 is provided directly under the through hole 19. A position where the though hole 19 is formed may be situated at a different position from the position where the high resistance bump 14 is provided by forming the wiring on the back surface of the interposer 12.

The resin package 13 is formed as covering the above mentioned monolithic IC 11, the wire 16, the bonding pad 17, the wiring 18 and others. Because of this, the monolithic IC 11, the wire 16, the bonding pad 17, the wiring 18 are protected by the resin package 13. The resin package 13 is made of epoxy resin for example and formed by a molding method.

Figure 2:
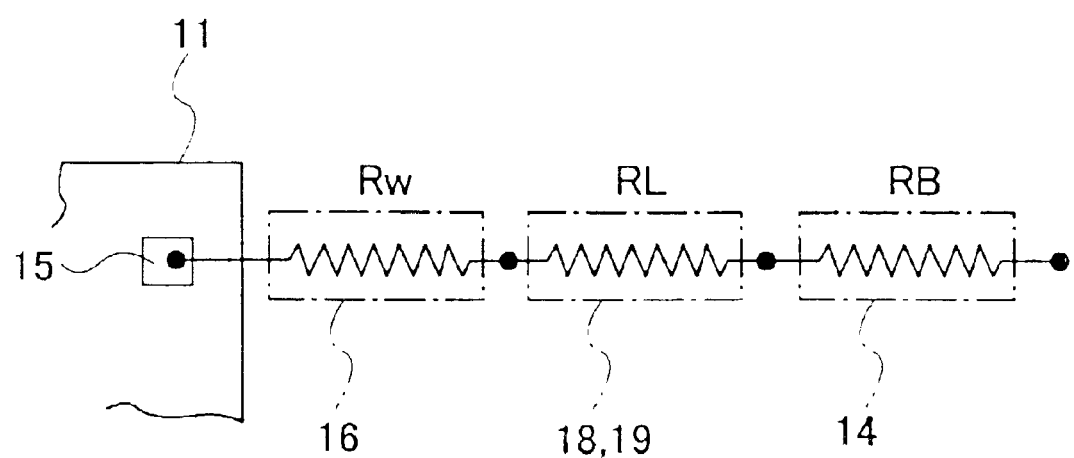
FIG. 2 is a view of an equivalent electric circuit from an electrode pad of the IC package to a bump according to the present invention.

Next, an equivalent electric circuit from the monolithic IC 11 to the high resistance bump 14 will be described. FIG. 2 is a view of the equivalent electric circuit from the monolithic IC 11 to the high resistance bump 14.

As shown in FIG. 2, the wire 16, the wiring 18 and the through hole 19 are connected from the electrode pad 15 of the monolithic IC 11 to the high resistance bump 14. Here, an impedance (resistance) of the wire 16 is expressed as $R_w(\Omega)$ a synthetic impedance of the wiring 18 and the through hole 19 is expressed as $R_L(\Omega)$, and an impedance of the high resistance bump 14 is expressed as $R_E(\Omega)$.

Generally, the wire 16 has an impedance $R_w(\Omega)$ of approximately 0.1 Ω, and the wiring 18 and the through hole 19 have a synthetic impedance $R_w(\Omega)$ of approximately 0.1 Ω. In the IC package 10A in this embodiment, an impedance $R_B$ of the high resistance bump 14 is set high, in the range 10 Ω through 100 kΩ.

Thus, it is possible to make the high resistance bump 14 have a high resistance value of the bump by selecting a proper material for the high resistance bump 14. Conventionally, a typical bump has the resistance value of approximately 0.1 Ω.

As described above, it is possible to use the high resistance bump 14 as protection means for protecting the monolithic IC 11 from the ESD, namely a circuit for improving the ESD resisting amount and the ESD resisting pressure by making the impedance (resistance) $R_B$ of the high resistance bump 14 high.

In a case where an operator or a handling device (hereinafter "electrified device") having an electrification of static electricity comes in contact with the high resistance bump 14 of the IC package 10A in a manufacturing process or a mounting process of the IC package 10A will be assumed.

In this case, as described above, the high resistance bump 14 has a high resistance value. Therefore, even if the electrified device comes in contact with the high resistance bump 14 so that the ESD is generated, the energy of the static electricity is converted into thermal energy (joule heat) in the high resistance bump 14 so that the energy of the static electricity is consumed. Accordingly, even if the electrified device comes in contact with the high resistance bump 14 so that the ESD is generated, the monolithic IC 11, the wire 16, the wiring 18 and the through hole 19 are prevented from being damaged.

Thus, in the IC package 10A of this embodiment, high resistance bump 14 functions as protection means for protecting the monolithic IC 11 from the ESD. That is, the monolithic IC 11 has a structure in which the high resistance bump 14 (external connection terminal) functions as protection means.

Because of this structure, it is possible to improve the ESD resisting amount and the ESD resisting pressure with a simple structure so that the monolithic IC 11, the wire 16, the wiring 18, and the through hole 19 are prevented from being destroyed by the ESD. Furthermore, the monolithic IC 11 does not have a circuit for improving the ESD resisting amount and the ESD resisting pressure. Therefore, it is possible to make the monolithic IC 11 small so that the IC package 10A can be made small.

FIG. 3 shows an IC package 10B which is a modified example of the IC package 10A of the first embodiment of the present invention. In FIG. 3, parts that are the same as the parts shown in FIG. 1 are given the same reference numerals, and explanation thereof will be omitted.

In the IC package 10A of the first embodiment, all six of the bumps are high resistance bumps 14. However, it is not always necessary to take measures to protect against the ESD for all of the electrode pads 15 because of the way of handling the monolithic IC 11.

Hence, in the modified example, as shown in FIG. 3-(C), two bumps connected to the electrode pad 15 for which it is necessary to protect against the ESD are the high resistance bumps 14 shown as doted areas in FIG. 3(C) and the remaining four bumps are low resistance bumps having a resistance value of approximately 0.1 $\Omega$ as in the conventional art. Thus, it is not always necessary to provide the high resistance bump 14 for all of the bumps provided in the IC package. Rather, the high resistance bump 14 can be provided for the bumps in which the protection against ESD is necessary.

In the first embodiment and the modified example of the first embodiment, the high resistance bumps 14 and 20 are used as external connection terminals. The present invention can be applied to an IC package such as a DIP package, QFP package or the like, in which a lead is used as an external connection terminal.

Next, the second embodiment of the present invention will be described.

An IC package 10C of the second embodiment of the present invention is shown in FIG. 4. FIG. 4-(A) is a cross sectional view of the IC package 10C of the second embodiment of the present invention, FIG. 4-(B) is a plan view of the IC package 10C of the second embodiment of the present invention in a state where the resin package 13 is removed, and FIG. 4-(C) is a bottom view of the IC package 10A of the second embodiment of the present invention. In FIG. 4, parts in the structure that are the same as the parts in the structure of the IC package 10A of the first embodiment are given the same reference numerals, and explanation thereof will be omitted.

In the IC package 10A of the first embodiment, a bump of the external connection terminal is used as the high resistance bump 14 in order to improve the ESD resisting amount and the ESD resisting pressure and prevent the monolithic IC 11 from being destroyed by the ESD.

In the IC package 10C of this embodiment, the impedance $R_L$ of the high resistance wiring 21, by which the bonding pad 17 and the through hole 19 are connected, is set in the range 10 $\Omega$ through 100 k$\Omega$ so that the high resistance wiring 21 has a high resistance. See FIG. 2. The high resistance wiring 21 is used as protection means for protecting the monolithic IC 11 from the ESD, namely a circuit for improving the ESD resisting amount and the ESD resisting pressure.

Thus, it is possible to easily make the high resistance wiring 21 have a high resistance value by properly selecting the material for the high resistance wiring 21 properly. Furthermore, in a case where the bonding pad 17 is formed with the high resistance wiring 21 in a body, it is possible to form the bonding pad 17 with the same high resistance material as the high resistance wiring 21. In addition, the through hole 19 can be formed by the same high resistance material. In this case, in addition to the high resistance wiring 21, the bonding pad 17 and the through hole 19 made of high resistance material function as protection means for protecting the monolithic IC 11 from the ESD.

Thus, in the IC package 10C of this embodiment, the monolithic IC 11 has a structure in which the high resistance wiring 21 (external connection terminal) functions as the protection means so that the high resistance wiring 21 protects the monolithic IC 11 from the ESD. Because of the above mentioned structure, the ESD resisting amount and the ESD resisting pressure can be improved with a simple structure. Accordingly, the monolithic IC 11 and others can be prevented from being destroyed due to the ESD.

Furthermore, in this embodiment as well as the first embodiment, the monolithic IC 11 does not have a circuit for improving the ESD resisting amount and the ESD resisting pressure. Therefore, it is possible to make the monolithic IC 11 small so that the IC package 10A can be made small.

FIG. 5 shows an IC package 10D which is a modified example of the IC package 10C of the second embodiment of the present invention. In FIG. 5, parts that are the same as the parts shown in FIG. 4 are given the same reference numerals, and explanation thereof will be omitted.

In the IC package 10C of the second embodiment, all six of the wiring segments are the high resistance wiring 21. However, it is not always necessary to take measures to protect against the ESD for all of the high resistance wiring segment 21 because of the way of handling the monolithic IC 11.

In the modified example, as shown in FIG. 5-(B), three bumps connected to the electrode pad 15 for which it is necessary to provide protection against the ESD are the high resistance wiring 21 segment shown as dotted areas in FIG. 5-(B) and the remaining three wiring segments are the wiring 18 having a resistance value of approximately 0.1 $\Omega$ the same as a conventional wiring. Thus, it is not always necessary to provide the high resistance wiring 21 for all of the wiring segment provided in the IC package. Rather, the high resistance wiring 21 can be provided for the wiring segments in which the ESD protection is necessary.

Furthermore, in this modified example, the high resistance bump 14 is used for a bump connected to the high resistance wiring 21. Thus, the high resistance bump 14 and the wiring 21 having high resistance may be provided at the same time or selectively.

In the above mentioned first and second embodiments, the protection circuit is unified with the bumps or the wiring provided in the IC package.

In a case where the protection circuit, as a separate part such as a resistance chip, is provided on the interposer like the hybrid IC, the number of the parts increases and it is necessary for the resistance chip to be provided at the respective external connection terminal. As a result of this, the IC package is made large so that manufacturing cost increases.

The present invention is not limited to these embodiments, but variations and modifications may be made without departing from the scope of the present invention.

This patent application is based on Japanese priority patent application No. 2001-211481 filed on Jul. 12, 2001, the entire contents of which are hereby incorporated by reference.

What is claimed is:

1. A monolithic IC package, comprising:

a monolithic IC;

a package receiving the monolithic IC;

an external connection terminal having an impedance provided in the package and electrically connected to the monolithic IC by wiring;

wherein the impedance of the external connection terminal provides protection from an electrostatic discharge, thereby providing protection means for protecting the monolithic IC from the electrostatic discharge.

2. The monolithic IC package as claimed in claim 1, wherein the external connection terminal is a lead or bump having a resistance value of 10 Ω through 100 kΩ.

3. A monolithic IC package, comprising:

a monolithic IC;

a package receiving the monolithic IC;

an external connection terminal provided in the package and electrically connected to the monolithic IC by wiring having an impedance;

wherein the impedance of the wiring provides protection from the electrostatic discharge, thereby providing protection means for protecting the monolithic IC from the electrostatic discharge.

4. The monolithic IC package as claimed in claim 3, wherein the wiring is a wire bonding or a wiring pattern having a resistance value of 10 Ω through 100 kΩ.

5. A monolithic IC package, comprising:

a monolithic IC;

a package receiving the monolithic IC;

an external connection terminal having an impedance provided in the package and electrically connected to the monolithic IC by wiring also having an impedance;

wherein the collective impedance of the external connection terminal and the wiring provides protection from the electrostatic discharge, thereby providing protection means for protecting the monolithic IC from the electrostatic discharge.

6. The monolithic IC package as claimed in claim 5, wherein the external connection terminal is a lead or bump having a resistence value of 10 Ω through 100 kΩ, and the wiring is a wire bonding or a wiring pattern having a resistance value of 10 Ω through 100 kΩ.

* * * * *